(12) United States Patent
Wayburn et al.

(10) Patent No.: US 6,975,028 B1
(45) Date of Patent: Dec. 13, 2005

(54) THERMAL APPARATUS FOR ENGAGING ELECTRONIC DEVICE

(75) Inventors: Lewis S. Wayburn, Irmo, SC (US); Charles M. Mahaffey, Swansea, SC (US); Ian G. Spearing, Lexington, SC (US); Derek E. Gage, Irmo, SC (US); Todd C. Sharpley, Atlanta, GA (US); Cynthia M. Barnes, Columbia, SC (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 10/616,106

(22) Filed: Jul. 9, 2003

Related U.S. Application Data
(60) Provisional application No. 60/455,771, filed on Mar. 19, 2003.

(51) Int. Cl.[7] ............................................. H01L 23/24
(52) U.S. Cl. ...................... 257/718; 257/712; 257/714; 257/717
(58) Field of Search ................................ 257/712–719; 62/259.2; 324/760; 361/711, 710, 715, 719, 722

(56) References Cited

U.S. PATENT DOCUMENTS

| | | | |
|---|---|---|---|
| 3,757,530 A | | 9/1973 | Doyle et al. |
| 4,138,692 A | | 2/1979 | Meeker et al. |
| 5,083,373 A | * | 1/1992 | Hamburgen ............. 29/890.03 |
| 5,164,661 A | | 11/1992 | Jones |
| 5,574,627 A | | 11/1996 | Porter |
| 5,581,441 A | | 12/1996 | Porter |
| RE35,721 E | * | 2/1998 | Daikoku et al. ............. 165/185 |
| 5,847,293 A | | 12/1998 | Jones |
| 5,847,571 A | * | 12/1998 | Liu et al. ..................... 324/754 |
| 5,882,691 A | | 3/1999 | Conboy |
| 5,918,469 A | | 7/1999 | Cardella |
| 5,977,785 A | | 11/1999 | Burward-Hoy |
| 6,054,676 A | | 4/2000 | Wall et al. |
| 6,084,215 A | | 7/2000 | Furuya et al. |
| 6,147,506 A | | 11/2000 | Ahmad et al. |
| 6,184,504 B1 | * | 2/2001 | Cardella ..................... 219/513 |
| 6,297,660 B2 | | 10/2001 | Farnworth et al. |
| 6,543,246 B2 | * | 4/2003 | Wayburn et al. ........... 62/259.2 |
| 6,731,127 B2 | * | 5/2004 | Watts ......................... 324/765 |
| 2003/0019234 A1 | | 1/2003 | Wayburn et al. |

FOREIGN PATENT DOCUMENTS
| | | |
|---|---|---|
| WO | WO 98/46059 | 10/1998 |
| WO | 02/097342 | 12/2002 |

OTHER PUBLICATIONS
International Search Report dated Nov. 24, 2004 for corresponding PCT Application No. PCT/US2004/07890, international filing date Mar. 16, 2004.

* cited by examiner

Primary Examiner—Shouxiang Hu
(74) Attorney, Agent, or Firm—Foley & Lardner LLP (57) ABSTRACT

An apparatus for controlling the temperature of an electronic device utilizes a thermal head attached to a base structure including an integral isolation arrangement. For example, the isolation arrangement can be formed as a planar spring defined by slots in the base structure. The base structure has a manifold configured to route refrigerant fluid between the thermal head and components of a refrigeration system. The isolation arrangement is normally planar but is movable to facilitate engagement of the thermal head with the electronic device. The isolation arrangement also compensates for variations in the planar orientation of the electronic device.

45 Claims, 7 Drawing Sheets

THERMAL APPARATUS FOR ENGAGING ELECTRONIC DEVICE

Priority Claim

This application claims priority to U.S. Provisional Application Ser. No. 60/455,771, filed Mar. 19, 2003, which is hereby incorporated by reference.

BACKGROUND OF THE INVENTION

The present invention generally relates to apparatus for maintaining an electronic device at a predetermined temperature.

Thermal apparatus are utilized in the electronics industry for controlling the temperature of an electronic device during testing and burn-in procedures. In years past the devices under test (DUT) were of such low power dissipation, that the "Burn-In Ovens" were just that—ovens. It was necessary to add heat to get the DUTs up to the temperature at which testing was to be performed.

In the last few years, the situation has changed. Because the DUTs were becoming higher power, some cooling had to be applied. Initially that cooling came from just blowing air over them, and then adding heat sinks to them with air blowing. Later, the use of chilled liquid and Thermal Electric Coolers (TEC) was added to the arsenal. With these last two, the industry is using technology similar to other testing in that they use either heaters (in the case of the chilled liquid) and the TEC is a heater itself.

SUMMARY OF THE INVENTION

In one aspect, the present invention provides an apparatus for controlling the temperature of at least one electronic device. The apparatus comprises a flow loop through which refrigerant fluid is conducted to alternately absorb and release thermal energy. A thermal head is connected into the flow loop for engaging the electronic device.

The apparatus further includes a base structure including a mount portion to which the thermal head is mounted. The base structure defines at least part of the flow loop so as to route the refrigerant fluid to and from the thermal head. In addition, the base structure includes an isolation arrangement for the mount portion. The isolation arrangement normally maintains the mount portion in planar alignment with the base structure but permits movement of the mount portion to facilitate engagement of the thermal head with the electronic device.

In some exemplary embodiments, the isolation arrangement includes at least one flexible arm defining a flow passage for the refrigerant fluid. For example, the isolation arrangement may have a plurality of flexible arms, two of which define respective first and second flow passages. Often, it will be desirable to provide a total of three flexible arms supporting the mount portion. Embodiments are also contemplated in which the flexible arm defines two parallel flow passages for respective ingress and egress of refrigerant fluid to and from the thermal head.

Preferably, the base structure has a generally planar configuration in which the mount portion and isolation arrangement are formed by configured slots. In such embodiments, the base structure may comprise a plurality of generally planar layers juxtaposed to one another. For example, the base structure may have an intermediate layer sandwiched between top and bottom layers in which the intermediate layer defines flow passages for the refrigerant fluid. In other embodiments, the base structure may comprise two layers juxtaposed to one another. At least one of the two layers may have grooves defining the flow passages.

In many cases, the flow loop of the apparatus will circulate refrigerant fluid in a refrigeration system including a compressor and a condenser. The refrigerant fluid in such a system will change between gaseous and liquid states to alternately absorb and release thermal energy.

Embodiments are also contemplated in which the apparatus includes a valve located on the base structure to control flow of refrigerant fluid into the thermal head. In some cases, the valve may be attached to the mount portion of the base structure. The valve may also be formed by a pinch point configured in a flow passage of the base structure.

In another aspect, the present invention provides an apparatus for controlling the temperature of a plurality of electronic devices. The apparatus comprises a base structure and a plurality of thermal heads. The base structure has a plurality of planar springs supporting respective thermal heads. Each of the planar springs is movable to facilitate movement of a respective thermal head into engagement with a corresponding electronic device.

In exemplary embodiments, the apparatus includes a controllable mechanism operative to move the thermal heads into engagement with respective electronic devices. Often, it will be desirable for the controllable mechanism to be actuated by a source of pressurized gas. The controllable mechanism may preferably comprise a semirigid bladder which pushes the thermal heads into engagement with respective electronic devices. In some exemplary embodiments, the semirigid bladder may engage valves associated with the respective thermal heads. Preferably, the base structure may be configured as a manifold defining flow passages for routing refrigerant fluid to and from the thermal heads.

In a still further aspect, the present invention provides an apparatus comprising a generally planar base structure defining a mount portion to which a thermal head is mounted. The mount portion is supported by an isolation arrangement configured to permit movement of the thermal head between retracted and extended positions. The isolation arrangement is formed by configured slots defined in the base structure.

Another aspect of the present invention involves an apparatus comprising a generally planar base structure defining a mount portion to which a thermal head is mounted. The mount portion is supported by an isolation arrangement. The isolation arrangement is configured to permit movement of the thermal head between retracted and extended positions. In addition, the isolation arrangement includes at least one flexible arm defining a flow passage for conducting refrigerant fluid.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only and is not intended as limiting the broader aspects of the present invention, which broader aspects are embodied in the exemplary constructions.

Figure 1:
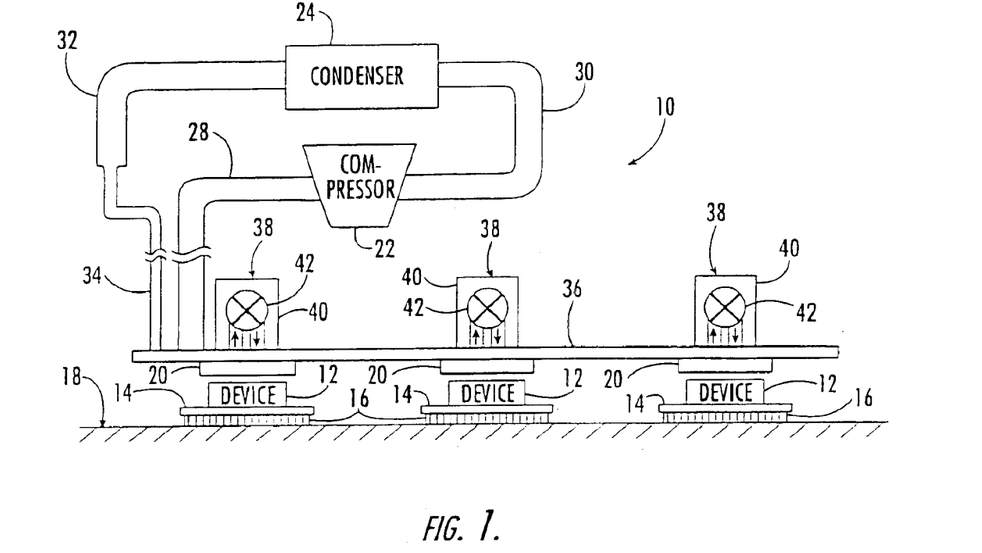
FIG. 1 is diagrammatic representation of an apparatus constructed in accordance with the present invention for controlling the temperature of an electronic device.

FIG. 1 illustrates an apparatus 10 constructed in accordance with the present invention. In this case, apparatus 10 functions to control simultaneously the temperature of multiple electronic devices 12 undergoing a burn-in procedure. As can be seen, devices 12 are integrated circuit devices mounted to respective carrier substrates 14. Substrates 14 each include a plurality of contact pins 16 (or other suitable contacts) mating with corresponding sockets of the burn-in fixture 18. As one skilled in the art will appreciate, fixture 18 supplies energy to power the respective devices 12, and also initiates the various read/write commands to which devices 12 are subjected during the burn-in procedure.

Apparatus 10 includes a plurality of thermal heads 20, each associated with a corresponding device 12. Thermal heads 20 are moved so that their respective bottom surfaces are brought into thermal engagement with the top surface of a corresponding device 12. As a result, the operational temperature of devices 12 will be desirably controlled.

In this case, thermal heads 20 are configured as evaporators in a refrigeration system also including a compressor 22 and a condenser 24. The refrigeration system employs a refrigerant fluid circulated around a fluid flow loop so as to alternately absorb and release thermal energy. This occurs when the refrigerant fluid changes between gaseous and liquid states in accordance with the well-known refrigeration cycle. The particular refrigerant chosen for this purpose will depend on the specific requirements of the application.

The refrigerant fluid absorbs excess thermal energy at the location of device 12 when it "evaporates" from a liquid state to a gaseous state. This evaporation occurs in a circuitous flow passage 26 (FIG. 4) defined in the respective thermal head. The low pressure gas exiting the thermal head is then fed along outlet tube 28 to compressor 22. The resulting high pressure gas is fed along tube 30 to condenser 24, where accumulated thermal energy dissipates. As a result, the refrigerant fluid is condensed to liquid form.

High pressure liquid from condenser 24 is fed back toward thermal head 20 along inlet tube 32. In this embodiment, the inner diameter of tube 32 changes at a predetermined location so to form a capillary tube 34.

As can be seen, thermal heads 20 are located under a generally planar base structure 36. In the illustrated embodiment, base structure 36 functions as a manifold defining flow passages by which refrigerant fluid is routed from capillary tube 34 to the respective thermal heads 20. Similarly, refrigerant fluid exiting the thermal heads is routed back to outlet tube 28 by flow passages of base structure 36.

One skilled in the art will recognize that base structure 36 comprises part of the flow loop about which the refrigerant fluid circulates. The apparatus is configured such that expansion of the refrigerant fluid occurs in the downstream portion of the flow loop to produce a desired temperature drop. The manner in which refrigerant expansion occurs depends on the particular design. For example, expansion may occur across the combination of capillary tube 34 and the internal flow passages of base structure 36.

In presently preferred embodiments, expansion may also occur at a controllable valve 38 positioned between tube 34 and inlet of the respective thermal head evaporators. In this case, each of the valves 38 is constructed having a valve housing 40 in which a valve element 42 is located. As described in copending application Ser. No. 09/871,526, incorporated herein by reference, valve element 42 functions to meter refrigerant fluid into the corresponding thermal head in a manner that achieves precise temperature control.

One skilled in the art will appreciate that a refrigeration system may be constructed comprising a thermal compressor plus liquid pump (i.e., a condenser at some temperature and therefore pressure below the saturation pressure of the vapor returning from the thermal head is connected to the return line). The vapor condenses in the condenser, then the liquid is pumped with an ordinary liquid pump to generate a pressure difference to help drive the delivery of the liquid to the thermal head. This could be depicted in FIG. 1 by replacing compressor 22 with a condenser and condenser 24 with a liquid pump. In situations where this arrangement can be used, significant energy savings over the arrangement shown in the drawing may be possible.

Also, a refrigeration effect can be achieved by warming the refrigerant, rather than just evaporating it. Generally, there are two effects for cooling: first, by change of state from liquid to gas (latent heating), and second, by warming the gas from some cooler temperature to some warmer temperature (sensible heating). Both effects may be employed in the thermal head, depending on thermal load conditions of the electronic device, although from latent cooling one can get significantly higher cooling effect per unit of refrigerant circulated within some allowable temperature variation.

Figure 2A:
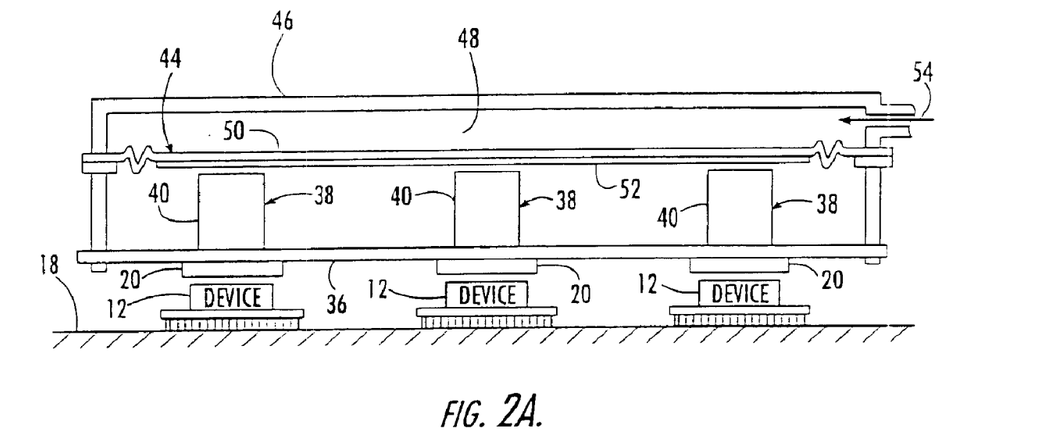
FIGS. 2A and 2B illustrate the base structure of the apparatus of FIG. 1 with the thermal heads in retracted and extended positions, respectively.
Figure 2B:
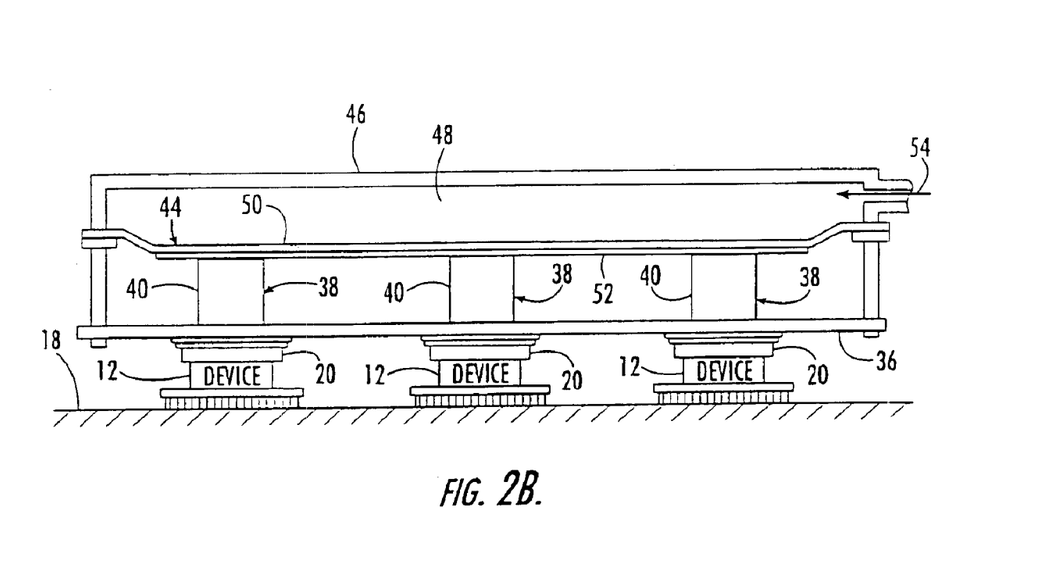

Referring now to FIGS. 2A and 2B, a controllable mechanism is preferably provided to move thermal heads 20 into engagement with respective devices 12. While a variety of different types of mechanisms may be utilized for this purpose (e.g., electromechanical), the illustrated embodiment utilizes an expandable bladder 44 to reliably and accurately move the thermal heads 20 into position. As can be seen, bladder 44 is mounted within a housing 46 so as to form a chamber 48. In this case, bladder 44 is a composite having a flexible sheet 50 mated to a semirigid sheet 52.

As indicated by arrow 54, pressurized gas such as "dry" air is introduced into chamber 48. The resulting expansion of bladder 44 causes semirigid sheet 52 to push against all of the respective valve housings 40 simultaneously. The configuration of flexible sheet 50 permits semirigid sheet 52 to remain substantially horizontal during this expansion. As a result, thermal heads 20 are moved from their retracted position (FIG. 2A) into an extended position (FIG. 2B) engaging devices 12 with a controllable force.

Figure 3A:
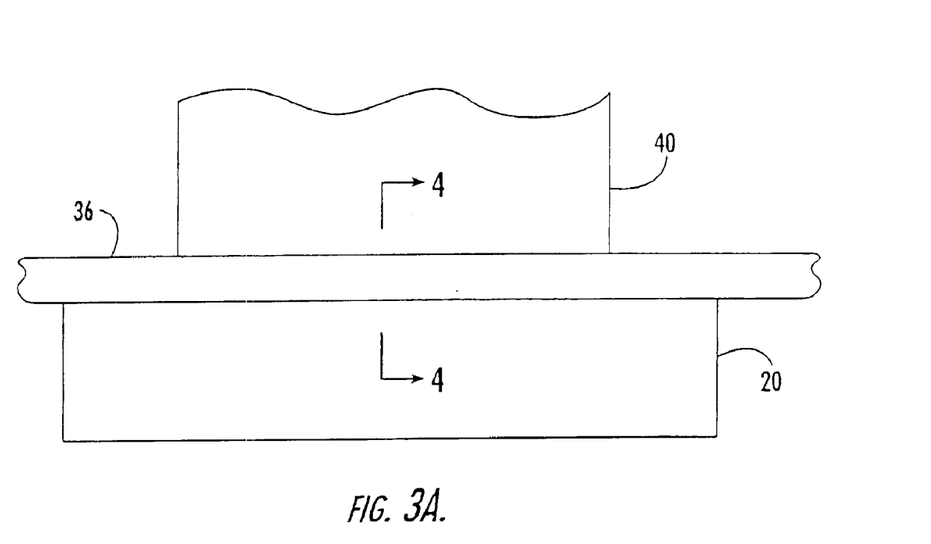
FIGS. 3A and 3B are enlarged views of a single thermal head in respective retracted and extended positions.
Figure 3B:
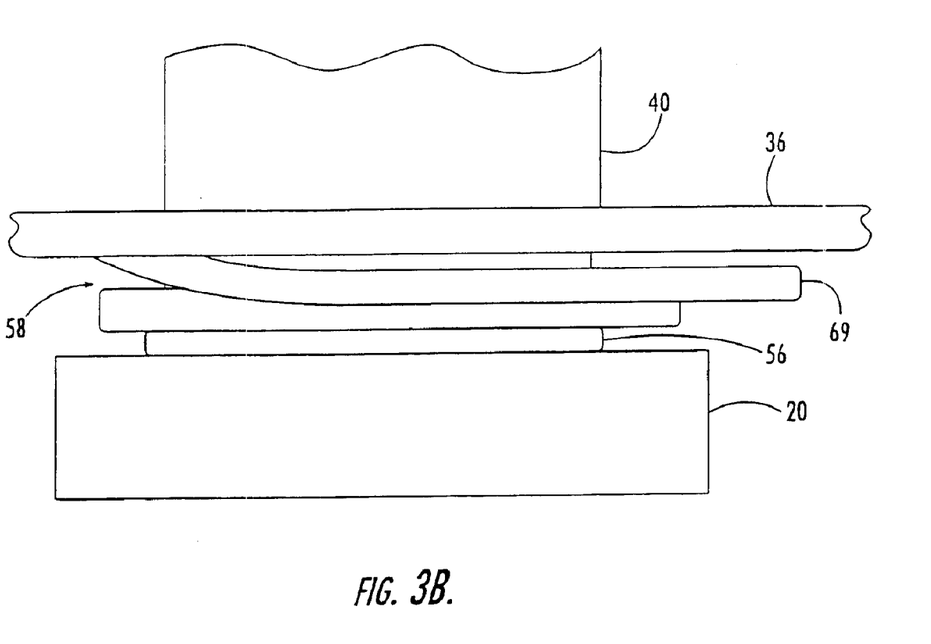

Certain additional features of the apparatus will now be described with reference to FIGS. 3A and 3B. As shown in FIG. 3A, thermal head 20 is juxtaposed to base structure 36 in the retracted position. As shown in FIG. 3B, however, thermal head 20 is spaced apart from the static portion of base structure 36 in the extended position. Toward this end, base structure 36 includes a respective mount portion 56 to which each thermal head 20 is attached. Mount portion 56 is supported by a corresponding isolation arrangement 58 which permits the downward movement of thermal head 20.

In the illustrated embodiment, isolation arrangement 58 is formed as a planar spring that will be in planar alignment with the static portion of base structure 36 in the retracted position. Thus, these elements are "hidden" in the side view of FIG. 3A.

Isolation arrangement 58 also allows thermal head 20 to "float" with respect to the static portion of base structure 36. This ensures co-planarity between thermal head 20 and device 12 despite some variation between their respective planar orientation. More effective thermal engagement (and thus heat transfer) between device 12 and thermal head 20 is thereby facilitated.

Figure 4:
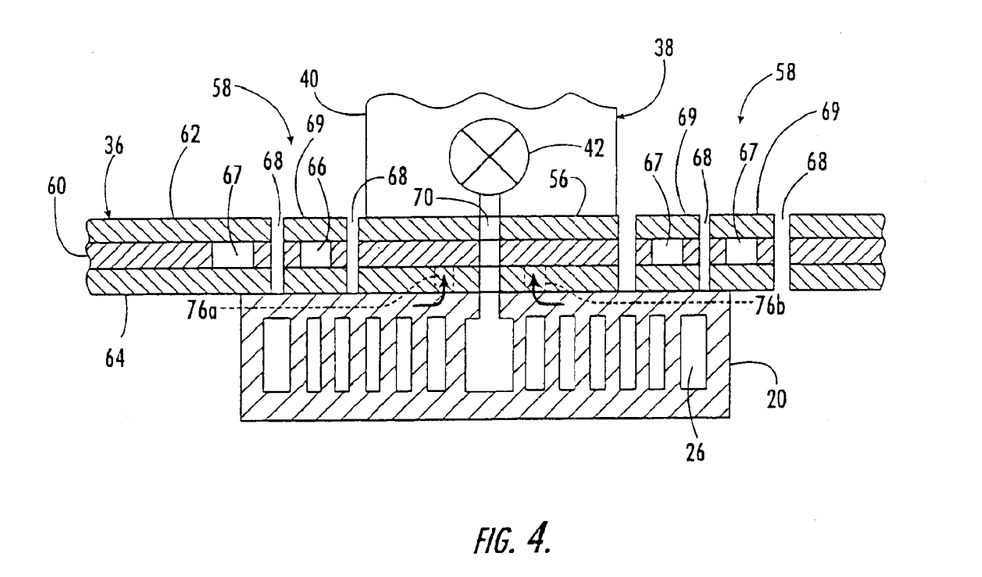
FIG. 4 is a cross sectional view (partially diagrammatic) taken along line 4—4 of FIG. 3A.

Referring now to FIG. 4, base structure 36 may be constructed having a plurality of generally planar layers juxtaposed to one another. The multilayer construction permits flow passages for the refrigerant fluid to be easily formed within the interior of base structure 36. For example, the illustrated embodiment includes an intermediate layer 60 sandwiched between a top layer 62 and a bottom layer 64. Intermediate layer 60 is configured to define the flow passages for ingress and egress of refrigerant fluid (indicated at 66 and 67, respectively). The layers of base structure 36 may be made of any suitable material, such as stainless steel. In embodiments where the layers are constructed of sheet metal, a brazing technique may be used to join them together.

A series of slots 68 are defined through base structure 36 in order to form mount portion 56 and isolation arrangement 58. Slots 68 thus form respective flexible arms 69 making up the planar spring.

Figure 5A:
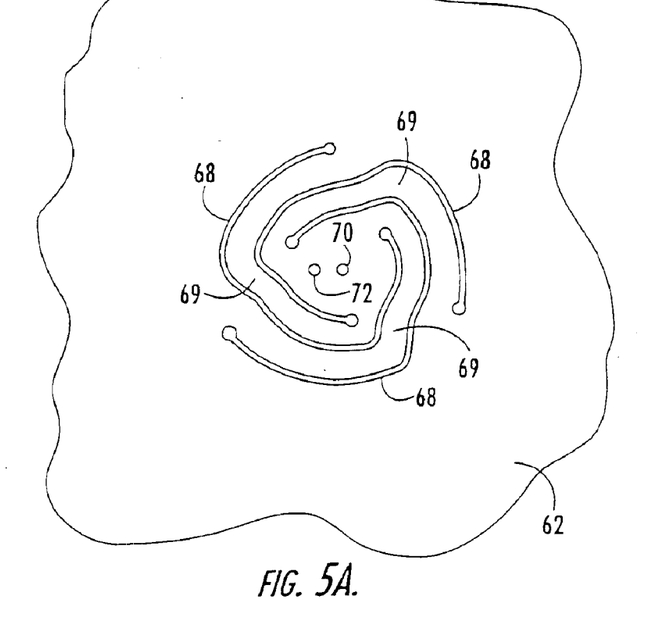
FIGS. 5A–C illustrate respective top, intermediate and bottom layers of the three-layer base structure shown in FIG. 4.
Figure 5B:
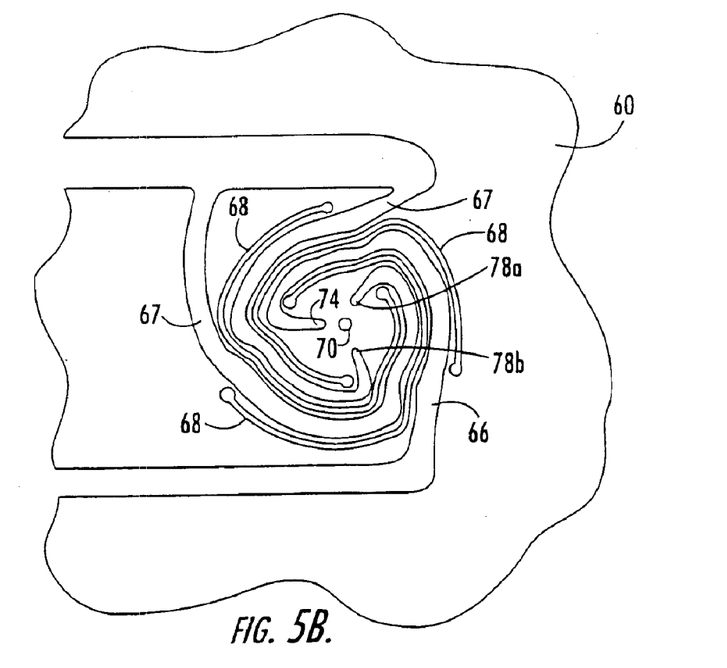
Figure 5C:
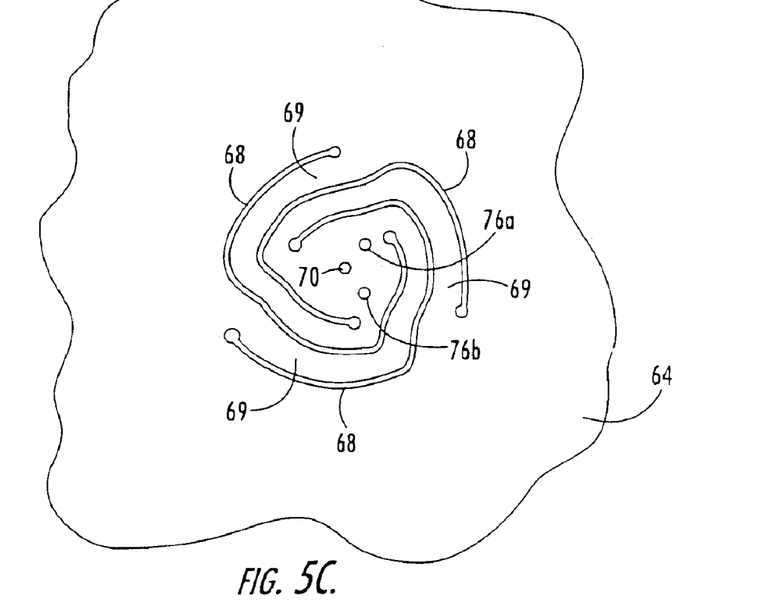

Referring now also to FIGS. 5A–5C, the specific configuration of layers 60, 62 and 64 in a preferred embodiment can be seen. All three layers define a central hole 70 through which refrigerant fluid from valve element 42 passes into the flow passages 26 of thermal head 20. Top layer 62 further defines a hole 72 aligned with the terminal portion 74 of inlet passage 66 (defined in intermediate layer 60). As a result, refrigerant fluid conducted along the inlet passage will pass through hole 72, valve element 42 and then down through hole 70. After traversing flow passage 26 of thermal head 20, the refrigerant fluid will exit thermal head 20 through exhaust holes 76*a–b* in bottom layer 64. Exhaust holes 76*a–b* are aligned with the terminal portions 78*a–b* of exhaust passages 67 (also defined in intermediate layer 60). Significantly, it can be seen that inlet passage 66 and exhaust passages 67 extend along flexible arms 69.

Figure 6:
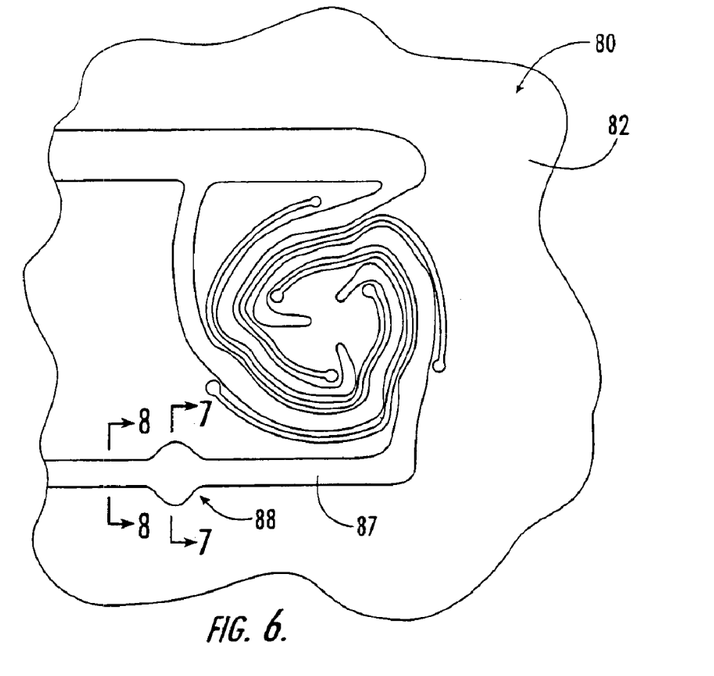
FIG. 6 is a top plan view of a first alternative base structure having two juxtaposed layers.
Figure 7A:
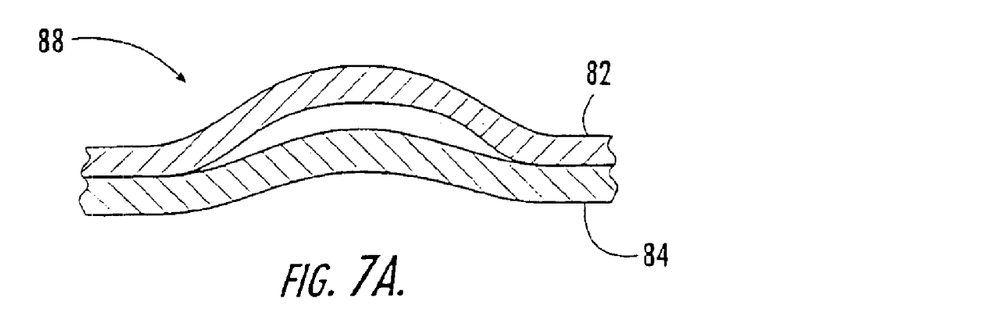
FIGS. 7A and 7B are cross sectional views taken along line 7—7 of FIG. 6 with the valve in respective open and closed positions.
Figure 7B:
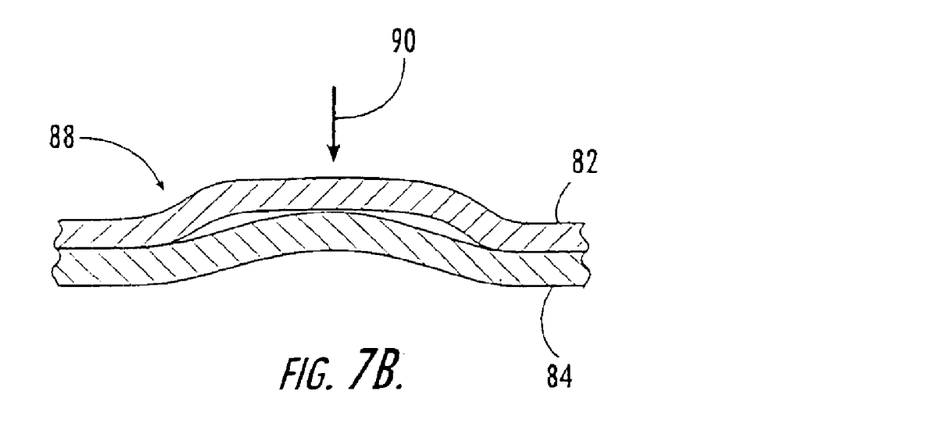
Figure 8:
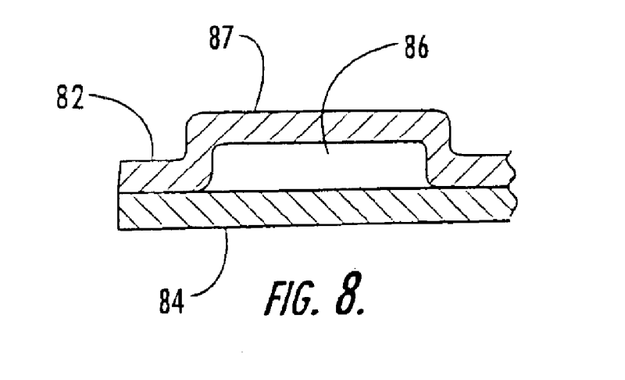
FIG. 8 is a cross sectional view taken along line 8—8 of FIG. 6.

Referring now to FIGS. 6–8, an alternative base structure 80 is illustrated. In this case, base structure 80 is formed of a top layer 82 and a bottom layer 84 rather than a three layer structure as described above. Because there is no intermediate layer, the fluid passages are formed by grooves defined in one or both of the two layers. For example, it can be seen in FIG. 8 that inlet passage 86 is formed by a groove 87 in top layer 82. Otherwise, the construction of base structure 80 may be substantially similar to that of base structure 36.

In some cases, the base structure can be configured having an integral valve for each of the thermal heads, rather than an external mounted valve as described above. As shown in FIG. 6, for example, inlet passage 86 has a widened portion 88 at a selected location. Referring now to FIG. 7A, portion 88 will be normally opened to allow flow of refrigerant fluid. When a downward force is applied, however, as indicated by arrow 90 of FIG. 7B, the inlet flow passage will be pinched off at this location. As a result, the flow of refrigerant fluid can be modulated to control the temperature of the associated thermal head. As one skilled in the art will appreciate, a suitable mechanism is provided to actuate the valve.

Figure 9:
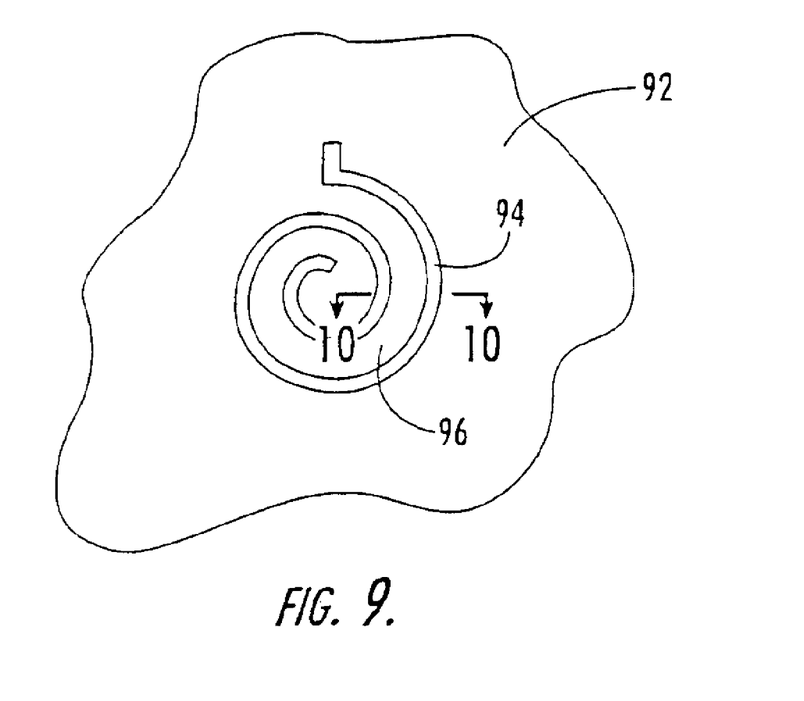
FIG. 9 is a top plan view of a second alternative base structure having a single flexible arm.
Figure 10:
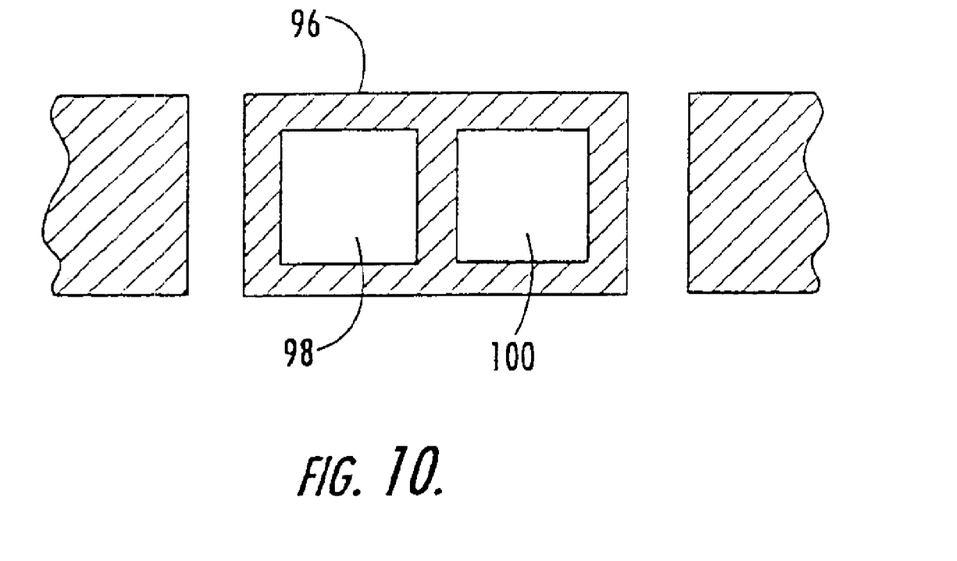
FIG. 10 is a cross sectional view as taken along line 10—10 of FIG. 9.

FIG. 9 illustrates a base structure 92 constructed in accordance with the present invention. In this case, the isolation arrangement is formed by a slot 94 defining a spiral of decreasing radius. Slot 94 thus produces an isolation arrangement having a single flexible arm 96 rather than multiple flexible arms as illustrated in the previous embodiments. As shown in FIG. 10, ingress and egress of refrigerant fluid is provided by a pair of fluid passages 98 and 100 extending in parallel along the length of arm 96.

It can be seen that the present invention provides apparatus for maintaining an electronic device at a selected temperature. While preferred embodiments of the invention have been shown and described, modifications and variations may be made thereto by those of skill in the art without departing from the spirit and scope of the present invention. For example, the cooled portion of the thermal head is configured as an evaporator in the above-described embodiments. Embodiments are also contemplated, however, in which a chilled liquid is circulated through the thermal head. Those of ordinary skill in the art will also appreciate that the foregoing description is by way of example only, and is not intended to be limitative of the invention so further described in the appended claims.

What is claimed is:

1. An apparatus for controlling the temperature of at least one electronic device, said apparatus comprising:
   a flow loop through which refrigerant fluid is conducted to alternately absorb and release thermal energy;
   a thermal head connected into said flow loop for engaging said electronic device;
   a base structure including a mount portion to which said thermal head is mounted, said base structure defining at least part of said flow loop so as to route said refrigerant fluid to and from said thermal head; and
   said base structure including an isolation arrangement normally maintaining said mount portion in planar alignment with said base structure but permitting movement of said mount portion to facilitate engagement of said thermal head with said electronic device, wherein said base structure comprises at least one configured slot so as to form a planar spring in said mount portion.

2. An apparatus as set forth in claim 1, wherein said isolation arrangement includes at least one flexible arm defining a flow passage for said refrigerant fluid.

3. An apparatus as set forth in claim 2, wherein said isolation arrangement has a plurality of flexible arms, two of said plurality defining respective first and second flow passages.

4. An apparatus as set forth in claim 3, wherein said plurality of flexible arms comprises a total of three flexible arms supporting in said mount portion.

5. An apparatus as set forth in claim 2, wherein said flexible arm defines two parallel flow passages for ingress and egress of refrigerant fluid to and from said thermal head, respectively.

6. An apparatus as set forth in claim 1, wherein base structure has a generally planar configuration, said mount portion and said isolation arrangement are both defined by said at least one configured slot.

7. An apparatus as set forth in claim 6, wherein said base structure comprises a plurality of generally planar layers juxtaposed to one another.

8. An apparatus as set forth in claim 7, wherein said base structure has an intermediate layer sandwiched between top and bottom layers.

9. An apparatus as set forth in claim 8, wherein said intermediate layer defines flow passages forming said at least part of said flow loop.

10. An apparatus as set forth in claim 6, wherein said base structure comprises two layers juxtaposed to one another, at least one of said two layers having grooves defining flow passages forming said at least part of said flow loop.

11. An apparatus as set forth in claim 1, wherein said flow loop circulates said refrigerant fluid in a refrigeration system including a compressor and a condenser such that said refrigerant fluid will change between gaseous and liquid states to alternately absorb and release thermal energy.

12. An apparatus as set forth in claim 1, further comprising a valve located on said base structure, said valve operative to control flow of said refrigerant fluid into said thermal head.

13. An apparatus as set forth in claim 12, wherein said valve is attached to said mount portion.

14. An apparatus as set forth in claim 12, wherein said valve is formed by a pinch point configured in a flow passage of said base structure.

15. An apparatus as set forth in claim 1, further comprising a controllable mechanism operative to move said thermal head into engagement with said electronic device.

16. An apparatus as set forth in claim 15, wherein said controllable mechanism is actuated by a source of pressurized gas.

17. An apparatus as set forth in claim 1, wherein said base structure has a plurality of mount portions adapted to carry a respective thermal head, each of said mount portions being supported by a respective isolation arrangement.

18. An apparatus as set forth in claim 1, wherein said isolation arrangement comprises a planar spring.

19. An apparatus for controlling the temperature of a plurality of electronic devices, said apparatus comprising:
   a plurality of thermal heads;
   a base structure having a plurality of planar springs supporting respective of said thermal heads; and
   each of said planar springs being movable to facilitate movement of a respective thermal head into engagement with a corresponding said electronic device,
   wherein said base structure comprises configured slots so as to form said planar springs.

20. An apparatus as set forth in claim 19, further comprising a controllable mechanism operative to move said thermal heads into engagement with respective of said electronic devices.

21. An apparatus as set forth in claim 20, wherein said controllable mechanism is actuated by a source of pressurized gas.

22. An apparatus as set forth in claim 21, wherein said controllable mechanism comprises a semirigid bladder which pushes said thermal heads into engagement with respective of said electronic devices.

23. An apparatus as set forth in claim 22, further including respective valves mounted to said base structure and associated with each of said thermal heads, said semirigid bladder engaging said valves to push said thermal heads into engagement with said electronic devices.

24. An apparatus as set forth in claim 19, wherein said base structure is configured as a manifold defining flow passages for routing refrigerant fluid to and from said thermal heads.

25. An apparatus as set forth in 24, wherein said base structure comprises a plurality of generally planar layers juxtaposed to one another.

26. An apparatus as set forth in claim 25, wherein said base structure has an intermediate layer sandwiched between top and bottom layers, said intermediate layer defining said flow passages.

27. An apparatus as set forth in claim 25, wherein said base structure comprises two layers juxtaposed top one another, at least one of said two layers having grooves defining said flow passages.

28. An apparatus as set forth in claim 19, wherein each said planar spring includes at least one flexible arm defining a flow passage for said refrigerant fluid.

29. An apparatus as set forth in claim 28, wherein each said planar spring includes a plurality of flexible arms, two of said plurality defining respective first and second flow passages.

30. An apparatus as set forth in claim 29, wherein said plurality of flexible arms comprises a total of three flexible arms.

31. An apparatus as set forth in claim 28, wherein said flexible arm defines two parallel flow passages for ingress and egress of refrigerant fluid to and from said thermal head, respectively.

32. An apparatus as set forth in claim 19, wherein said planar springs are each formed by configured slots defined in said base structure.

33. An apparatus comprising:
   a generally planar base structure defining a mount portion to which a thermal head is mounted, said mount portion being supported by an isolation arrangement;
   said isolation arrangement being configured to permit movement of said thermal head between retracted and extended positions; and
   said isolation arrangement being formed by configured slots in said base structure so as to form a planar spring in said mount portion.

34. An apparatus as set forth in claim 33, further comprising a controllable mechanism operative to move said thermal head into engagement with an electronic device.

35. An apparatus as set forth in claim 34, wherein said controllable mechanism is actuated by a source of pressurized gas.

36. An apparatus as set forth in 35, wherein said base structure comprises a plurality of generally planar layers juxtaposed to one another.

37. An apparatus as set forth in claim 33, wherein said base structure is configured as a manifold defining flow passages for routing refrigerant fluid to and from said thermal head.

38. An apparatus as set forth in claim 37, wherein said base structure has an intermediate layer sandwiched between top and bottom layers, said intermediate layer defining said flow passages.

39. An apparatus as set forth in claim 37, wherein said base structure comprises two layers juxtaposed top one another, at least one of said two layers having grooves defining said flow passages.

40. An apparatus comprising:
   a generally planar base structure defining a mount portion to which a thermal head is mounted, said mount portion being supported by an isolation arrangement;
   said isolation arrangement being configured to permit movement of said thermal head between retracted and extended positions; and
   said isolation arrangement including at least one flexible arm defining a flow passage for conducting refrigerant fluid,
   wherein said base structure comprises at least one configured slot so as to form a planar spring in said mount portion.

41. An apparatus as set forth in claim 40, wherein each said isolation arrangement includes a plurality of flexible arms, two of said plurality defining respective first and second flow passages.

42. An apparatus as set forth in claim 41, wherein said plurality of flexible arms comprises a total of three flexible arms supporting said mount portion.

43. An apparatus as set forth in claim 40, wherein said flexible arm defines two parallel flow passages for ingress and egress of refrigerant fluid to and from said thermal head, respectively.

44. An apparatus as set forth in claim 40, wherein said base structure comprises a plurality of generally planar layers juxtaposed to one another.

45. An apparatus as set forth in claim 44, wherein said mount portion and said isolation arrangement are both defined by said at least one configured slot.

* * * * *